United States Patent [19]
Cho et al.

[11] Patent Number: 6,074,930
[45] Date of Patent: Jun. 13, 2000

[54] METHOD FOR FORMING A TRENCH ISOLATION STRUCTURE COMPRISING AN INTERFACE TREATMENT FOR TRENCH LINER AND A SUBSEQUENT ANNEALING PROCESS

[75] Inventors: Kyung Hawn Cho; Han Seong Kim; Chan Sik Park; Won Soon Lee, all of Kyungki-do, Rep. of Korea

[73] Assignee: Samsung Electronics Co., Ltd., Suwon, Rep. of Korea

[21] Appl. No.: 09/154,782

[22] Filed: Sep. 17, 1998

[30] Foreign Application Priority Data

Jan. 7, 1998 [KR] Rep. of Korea ............... 11998-192

[51] Int. Cl.[7] .................................................. H01L 21/76
[52] U.S. Cl. ...................... 438/424; 438/435; 438/436; 438/431
[58] Field of Search ................................ 438/424, 431, 438/435, 436

[56] References Cited

U.S. PATENT DOCUMENTS

| | | |
|---|---|---|
| 4,666,556 | 5/1987 | Fulton et al. . |
| 5,679,599 | 10/1997 | Mehta . |
| 5,702,977 | 12/1997 | Jang et al. . |
| 5,726,090 | 3/1998 | Jang et al. . |
| 5,869,384 | 2/1999 | Yu et al. . |
| 5,885,883 | 3/1999 | Park et al. . |

*Primary Examiner*—Richard Booth
*Assistant Examiner*—Ron Pompey
*Attorney, Agent, or Firm*—Jones Volentine, L.L.P.

[57] ABSTRACT

A method for forming trench isolation in the silicon substrate is disclosed. This method allows for an improved bonding force between the sidewall silicon dioxide layer and the sidewall of the trench. After a trench is formed, sidewall silicon dioxide is grown on the sidewall of the trench by a first oxidation process. Then, PE-TEOS is deposited on the silicon substrate and the sidewall of the trench. The PE-TEOS layer around the entrance of the trench is then etched back using argon gas. The second oxidation process or the first annealing proceeds to enhance the bonding force between the sidewall silicon dioxide layer and the sidewall of the trench. After the second oxidation process or the annealing, the trench is filled with $O_3$-TEOS, and then PE-TEOS is deposited over the $O_3$-TEOS layer. Finally, the second annealing process follows.

34 Claims, 8 Drawing Sheets

6,074,930

METHOD FOR FORMING A TRENCH ISOLATION STRUCTURE COMPRISING AN INTERFACE TREATMENT FOR TRENCH LINER AND A SUBSEQUENT ANNEALING PROCESS

BACKGROUND OF THE INVENTION

1. Field of the Invention

The present invention relates generally to a method for fabricating a semiconductor device and more particularly to a method for forming trench isolation having the step of enhancing the bonding force between the sidewall silicon dioxide layer and the sidewall of the trench.

2. Description of the Prior Art

Techniques such as local oxidation of silicon (LOCOS) and selective polysilicon oxidation technology (SEPOX) have been used to decouple the metal oxide semiconductor (MOS) transistors created on a silicon substrate. However, as these circuits become highly integrated, these conventional isolation techniques are not available, since they are limited to devices with a linewidth under 0.35 µm. The application of silicon etching, so called trench etching technology, has emerged with the need for a deeper (3.0 µm or more) and narrower (1.25 µm or less) slots or trenches in a silicon substrate.

Generally, a trench is used to isolate devices in complementary MOS (CMOS) and bipolar circuits. Vertical capacitors or transistors can also be fabricated inside the trench. The ideal trench has inwardly sloped walls and a rounded bottom. The sloped wall, caused by redeposition during etching, is necessary to eliminate the formation of a void in the trench during the conformal deposition process. The rounded bottom is desirable to eliminate an electric field concentration.

This trench isolation process can proceed in the standard CMOS process. This trench isolation structure can be formed on and in the epitaxial silicon substrate. The trench is etched deep enough to penetrate through the epitaxial layer, which effectively decouples the bipolar transistors.

FIG. 1 is a flow chart of a conventional method for forming a trench isolation structure. As shown in FIG. 1, a silicon dioxide layer ($SiO_2$) is initially deposited on the silicon substrate (Si), and then a silicon nitride layer and a hard mask are deposited thereon in succession (Step 61). The hard mask is a silicon dioxide layer formed by high temperature oxidation. This hard mask serves as an etching mask against reactive ion etching.

The silicon dioxide layer, silicon nitride layer, and hard mask are then selectively removed to expose the underlying silicon substrate by photo etching to form a trench (step 62). After the photo etching process, an ashing/strip process for removing the photoresist ensues. The layers of silicon nitride and hard mask are defined and then used as an etching mask during a dry etching of the silicon substrate to form a deep and narrow trench (step 63). A reactive ion etching method is commonly used for this dry etching. In reactive ion etching, the physical etch rate is higher than the chemical etch rate.

After the trench is formed, a sidewall of silicon dioxide is grown to form an insulating layer by sidewall oxidation (step 64). The sidewall silicon dioxide layer is provided to protect the exposed sidewall of the trench and serves as an autodoping barrier between an active region and a field region. The trench is then filled with an insulator by depositing two or more thin films. After this, the plasma enhanced tetraethylorthosilicate (PE-TEOS) layer is then formed (step 65). The PE-TEOS layer is first deposited on the silicon substrate and sidewall of the trench (step 65a), and then the PE-TEOS layer around the entrance of the trench is etched back using argon gas (step 65b). The etchback process (step 65b) makes the entrance of the trench wider and simplifies the process of filling the trench.

Due to the action of plasma during the etchback process (step 65b), the surface of the PE-TEOS layer becomes rough. Therefore, an $NH_3$ plasma treatment (step 66) is provided to make the surface of the PE-TEOS layer smooth by removing the impurities deposited on the PE-TEOS layer and to enhance the bonding force between the PE-TEOS layer and an ozone TEOS ($O_3$-TEOS) layer that will be deposited on the PE-TEOS layer.

The $O_3$-TEOS layer and another PE-TEOS layer are deposited on the silicon substrate and sidewall of the trench at step 67, and finally an annealing process 68 follows. The annealing process 68 occurs at about 1050° C. under $N_2$ atmosphere for about 60 minutes.

The disadvantages of the method for forming trench isolation using a trench etching process (step 63) are as follows:

First, the bonding between the sidewall of the trench and the sidewall silicon dioxide layer may become weaker during the trench etching process (step 63) and the etchback process (step 65b) due to the effect of plasma on the sidewall of the trench.

Second, the sidewall silicon dioxide and sidewall of the trench ($SiO_2$-Si) interface can get separated. This separation at the $SiO_2$-Si interface is caused by thermal shrink during annealing (step 68) or by the oversaturation of ions or atoms in the $SiO_2$-Si interface while filling the trench with an insulator.

Thus, these defects at the $SiO_2$-Si interface may occur when trench isolation is formed according to a conventional process. Due to the defects such as dislocation and well leakage point, a resulting semiconductor chip may not operate correctly.

FIG. 2 is a schematic drawing of a vertical scanning electron microscope (V-SEM) cross-sectional view of a trench. As shown in FIG. 2, a void 15 has been formed between the silicon substrate 10 and the sidewall silicon dioxide layer 12. This void 15 has its origin in the material formed at the $SiO_2$-Si interface 11 or in the separation at the $SiO_2$-Si interface 11. If the etch rate of the material formed at the $SiO_2$-Si interface 11 is higher than that of the sidewall silicon dioxide 12a and the silicon substrate 10, this material is etched away in advance of the sidewall silicon dioxide 12a and the silicon substrate 10 during the chemical process for V-SEM analysis. That is the reason why the $SiO_2$-Si interface 11 is susceptible to damage.

FIG. 2 shows a silicon dioxide layer 12 on the silicon substrate 10, a silicon nitride layer 14, a hard mask 16, and a trench 13 filled with insulator 17. The insulator 17 may contain such materials as PE-TEOS 17c, $O_3$-TEOS 17b, and PE-TEOS 17a.

SUMMARY OF THE INVENTION

It is therefore an object of the present invention to provide improved method for forming a trench isolation having the step of enhancing the bonding between the sidewall silicon dioxide layer and the sidewall of the trench.

The present invention discloses a method for forming a trench isolation. The method for the present invention begins with depositing silicon dioxide on the silicon substrate. Silicon nitride is deposited over the silicon dioxide layer, and a hard mask over the silicon nitride layer. The silicon dioxide layer, silicon nitride layer, and hard mask are then etched to expose the underlying silicon substrate in which the trench will be formed. The trench is then formed by etching the exposed silicon substrate. A sidewall silicon dioxide is then grown on the sidewall of the trench by the first oxidation process. Then, PE-TEOS is deposited on the silicon substrate and the sidewall of the trench.

The second oxidation process proceeds to enhance the bonding force between the sidewall silicon dioxide layer and the sidewall of the trench. Alternatively, a first annealing can be used to enhance the bonding. After the second oxidation process or the the first annealing, the trench is filled with $O_3$-TEOS and then PE-TEOS is deposited on the $O_3$-TEOS layer. Finally, the second annealing process follows. Particularly, the oxidation in accordance with this invention, i.e., thermal oxidation, is carried out between 600 and 1200° C. using $O_2$ gas, or $O_2$ and HCl mixture gas, or $H_2$ and $O_2$ reactant gas. The first annealing proceeds between 600 and 1200° C. under an $N_2$ atmosphere for about 50 to 70 minutes, most preferably for about 60 minutes. The first annealing can proceed together with the second sidewall oxidation. Preferably, the first annealing proceeds after the second sidewall oxidation.

DETAILED DESCRIPTION OF THE PRESENT INVENTION

Figure 1:
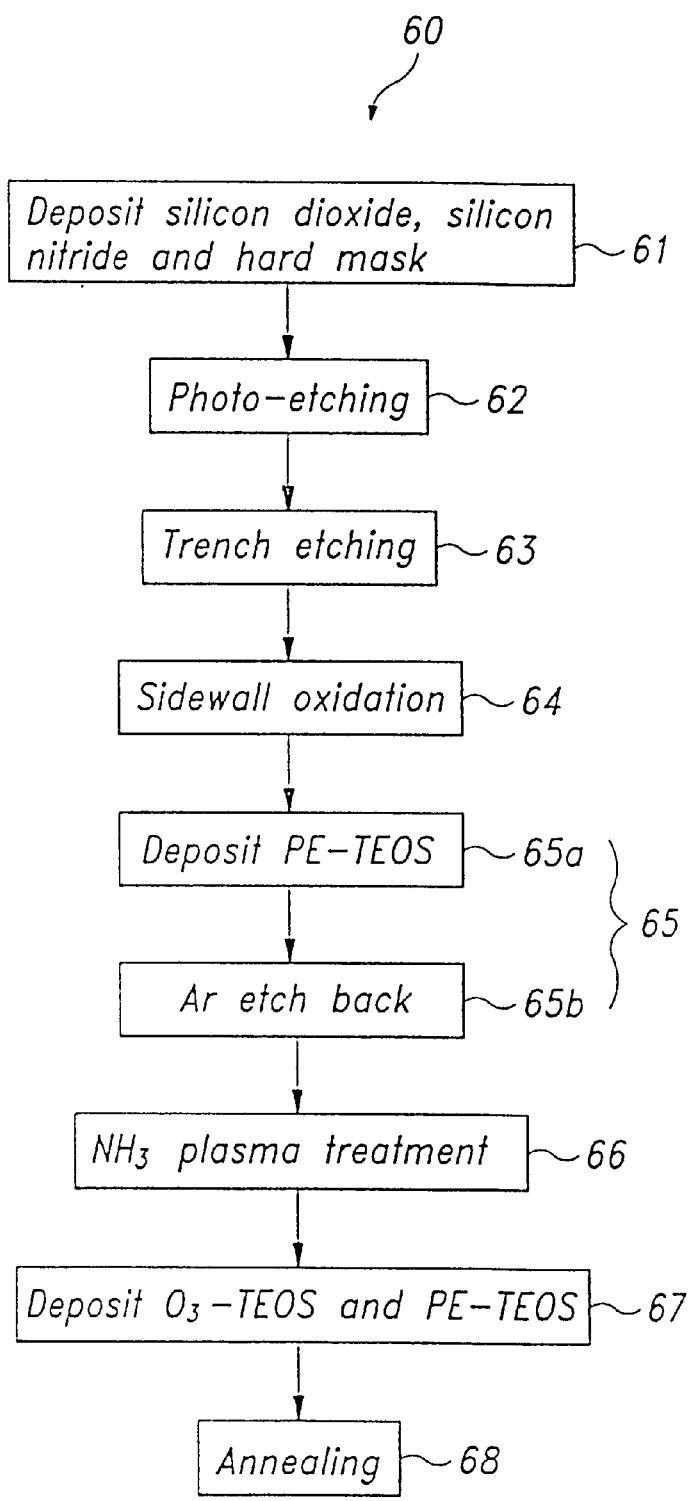
FIG. 1 is a flow chart of a conventional method for forming a trench isolation structure.
Figure 2:
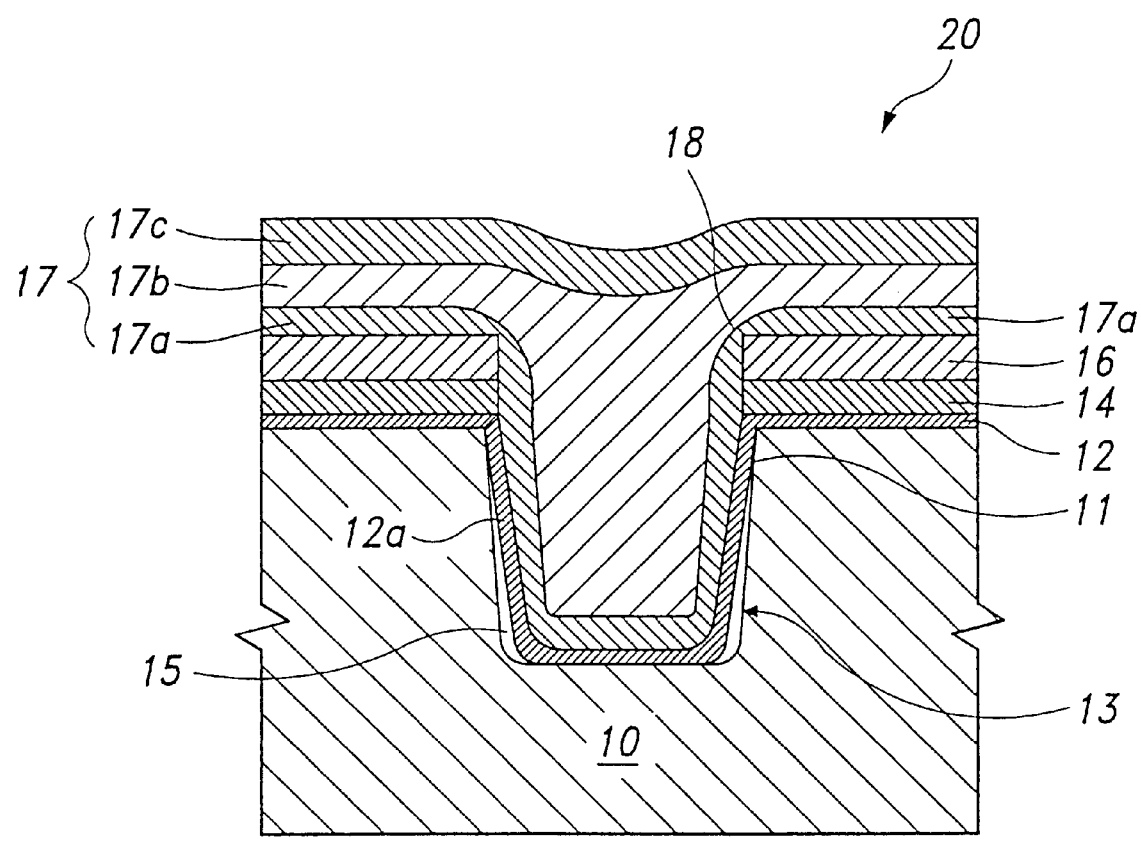
FIG. 2 is a schematic drawing of a V-SEM photograph of cross-sectional view of the trench in accordance with the method of FIG. 1.

The present invention will now be described more fully below with reference to accompanying drawings, in which a preferred embodiment of the invention is shown. This invention may, however, be embodied in many different forms and should not be construed as limited to the embodiment set forth herein. Rather, this embodiment is provided so that this disclosure will be thorough and complete, and will fully convey the scope of the invention to those skilled in the art. In the drawings, like numbers refer to like elements throughout.

Figure 3:
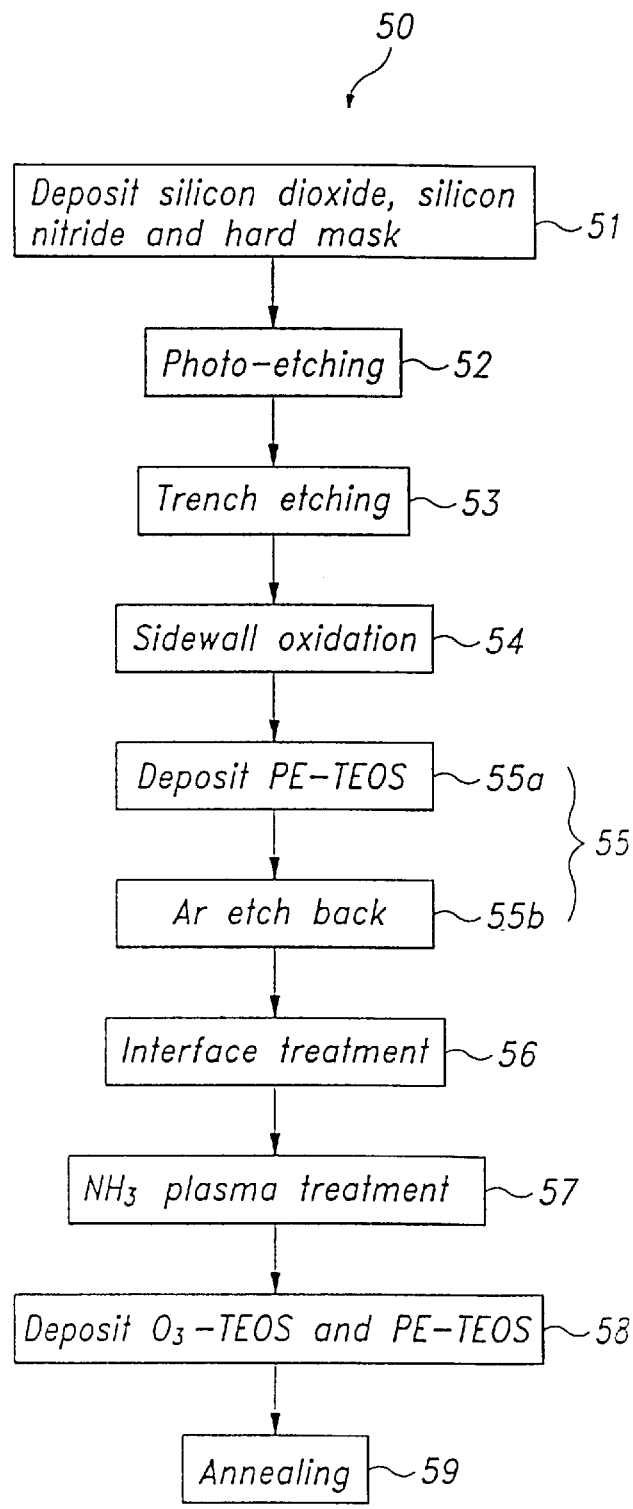
FIG. 3 is a flow chart of the method according to a preferred embodiment of the present invention.

FIG. 3 is a flow chart of the method according to a preferred embodiment of the present invention, and FIGS. 4–12 show various stages of the method for forming a trench isolation structure in accordance with a preferred embodiment of the present invention. In the following description, process steps to form trench isolation (illustrated in FIG. 3) are set forth with reference to FIGS. 4–12.

Figure 4:
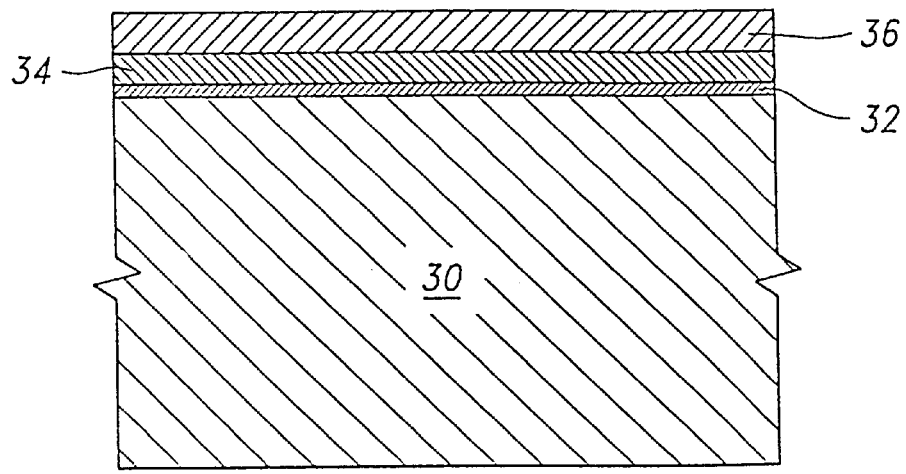
FIGS. 4–12 show various stages of the method for forming trench isolation in accordance with a preferred embodiment of the present invention.

Referring to FIGS. 3 and 4, the method 50 of the present invention begins in step 51 by depositing silicon dioxide 32 on the silicon substrate 30. Silicon nitride 34 is then deposited over the silicon dioxide layer 32, and a hard mask 36 over the silicon nitride layer 34 (all in step 51). Silicon dioxide 32 and silicon nitride 34 are preferably deposited using a chemical vapor deposition (CVD). The hard mask 36 is a silicon dioxide layer preferably formed by high temperature oxidation. This hard mask 36 serves as an etching mask against reactive ion etching.

Referring to FIGS. 3 and 5 to 7, a photo etching is performed (step 52) in which the silicon dioxide layer 32, the silicon nitride layer 34, and the hard mask 36 are selectively removed down to an underlying silicon substrate 30 to form a trench.

Figure 5:
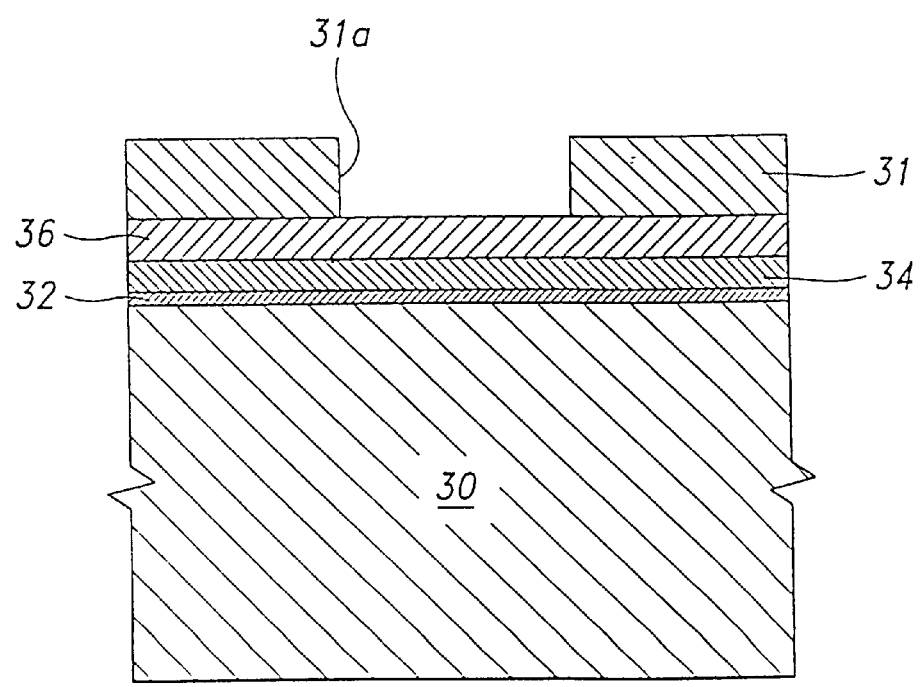

Referring to FIG. 5, photoresist 31 is applied to form a uniform film and is then exposed to light to transfer the mask pattern to the hard mask 36. Depending on the type of polymer used, either an exposed or a non-exposed area 31a of photoresist is removed during the developing process.

Figure 6:
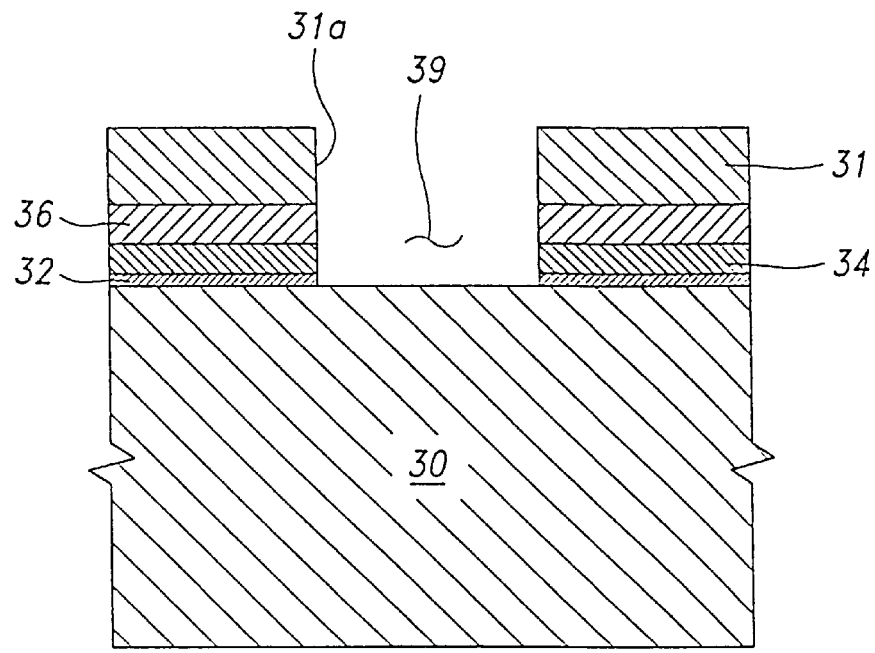

Referring to FIG. 6, the portions of the hard mask 36, the silicon nitride layer 34 and the silicon dioxide layer 32, which are not protected by the photoresist 31, are removed by dry etching to expose the underlying silicon substrate 30. Etching those unprotected layers exposes the underlying silicon substrate 30 in which the trench will be formed. The reference numeral 39 designates the opening which is the part from which the hard mask 36, the silicon nitride layer 34 and the silicon dioxide layer 32 are removed.

Figure 7:
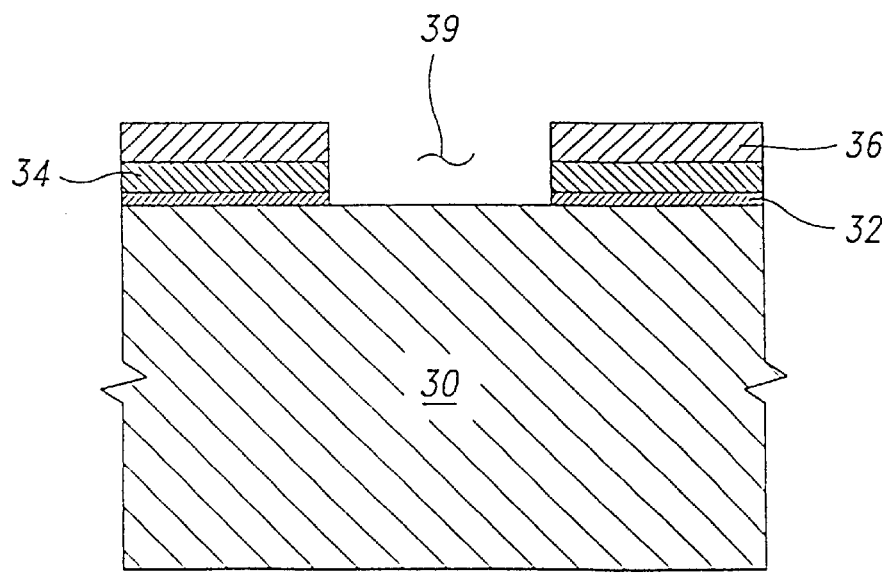

Referring to FIG. 7, after photo etching (step 52), an ashing/strip process of removing the photoresist 31 ensues.

Figure 8:
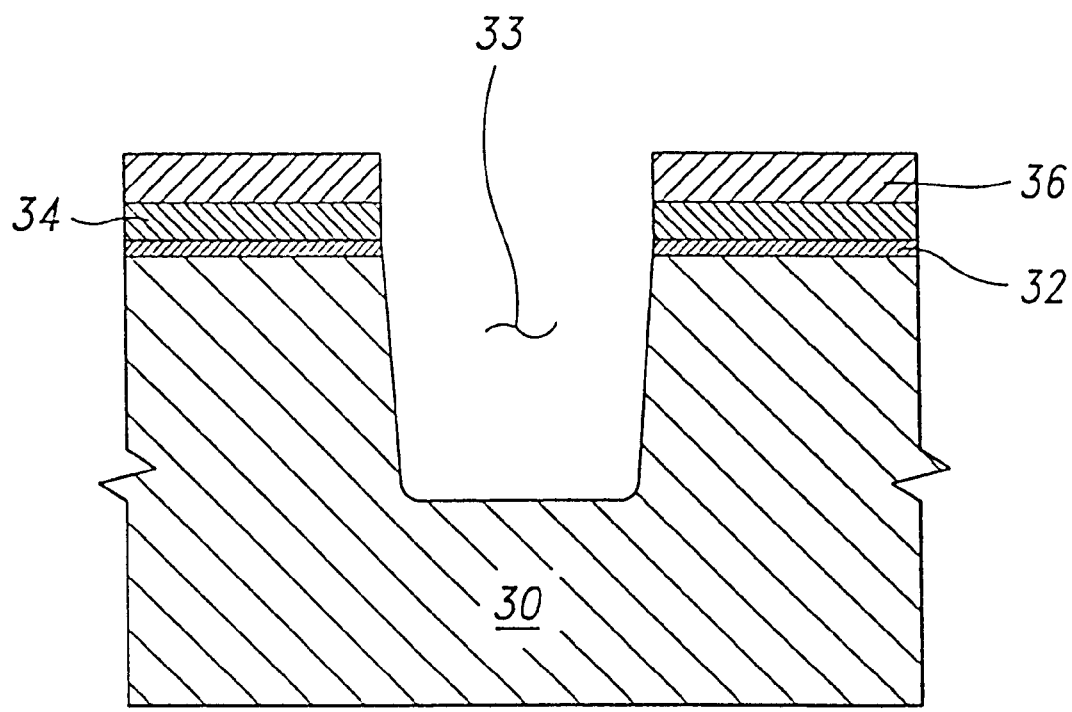

Referring to FIGS. 3 and 8, a trench etching step is performed (step 53) in which a trench 33 is formed in the silicon substrate 30. After the ashing/strip process, the silicon nitride layer 34 and the hard mask 36 are used as an etching mask during dry etching of the exposed portion of the silicon substrate 30 to form the trench 33. The reactive ion etching method is commonly used in dry etching. In reactive ion etching, the physical etch rate is higher than the chemical etch rate. The depth of the trench 33 is preferably about 0.8 $\mu$m in the preferred embodiment of present invention.

Figure 9:
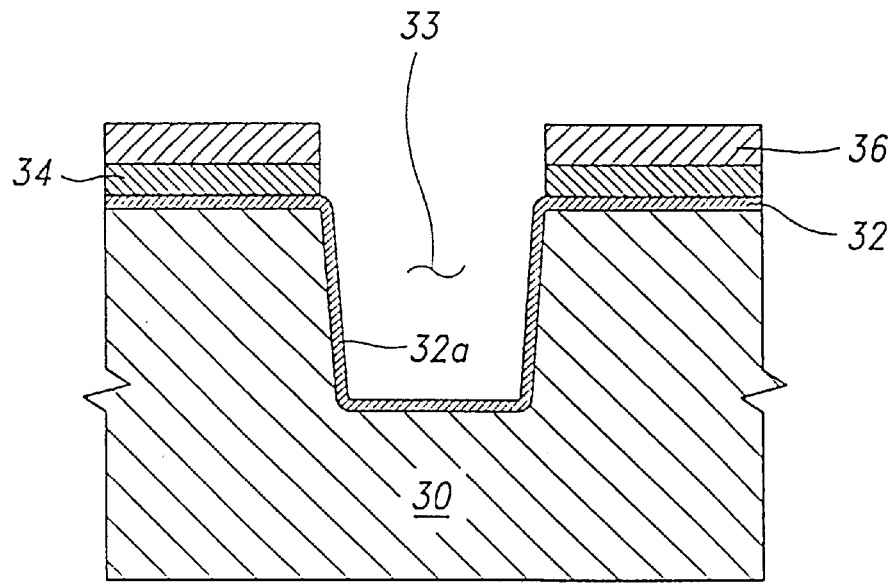

Referring now to FIGS. 3 and 9, a first sidewall oxidation process is performed (step 54) in which sidewall silicon dioxide 32a is grown to be used as an insulator on the sidewall of the trench 33. The first sidewall oxidation process (step 54) is preferably a thermal oxidation process which is preferably carried out between 600 and 1200° C. using an oxidizer such as $O_2$, $H_2O$, or HCl. More specifically, the sidewall silicon dioxide 32a is preferably grown by thermal oxidation in a CVD reactor between 600 and 1200° C. using $O_2$ gas, a mixture of $O_2$ HCl, or a mixture of $H_2$ and $O_2$ as reactant gases.

During the course of the sidewall silicon oxidation process (step 54), the Si-SiO$_2$ interface moves into the silicon substrate 30. The oxidation process (step 54) consumes the silicon substrate 30 for growth of the sidewall silicon dioxide 32a. Based on the densities of the silicon substrate 30 and the sidewall silicon dioxide 32a, 45% of the sidewall silicon dioxide 32a grows below the unoxidized silicon surface. The sidewall silicon dioxide 32a grows on the sidewall of the trench 33 and is combined with the silicon dioxide layer 32 on the silicon substrate 30. Thereafter, the trench 33 is filled with an insulator by depositing more than two thin insulating films.

Figure 10:
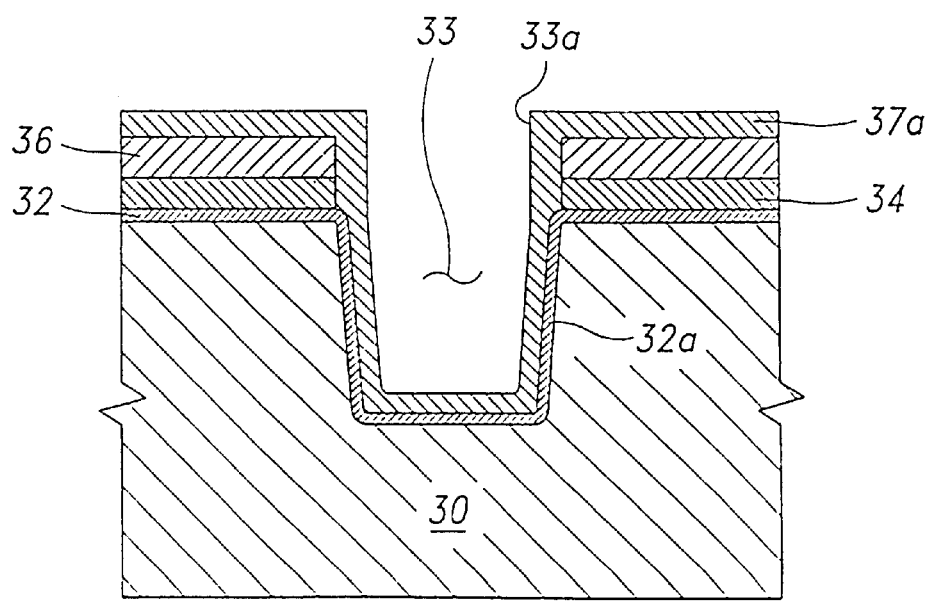
Figure 11:
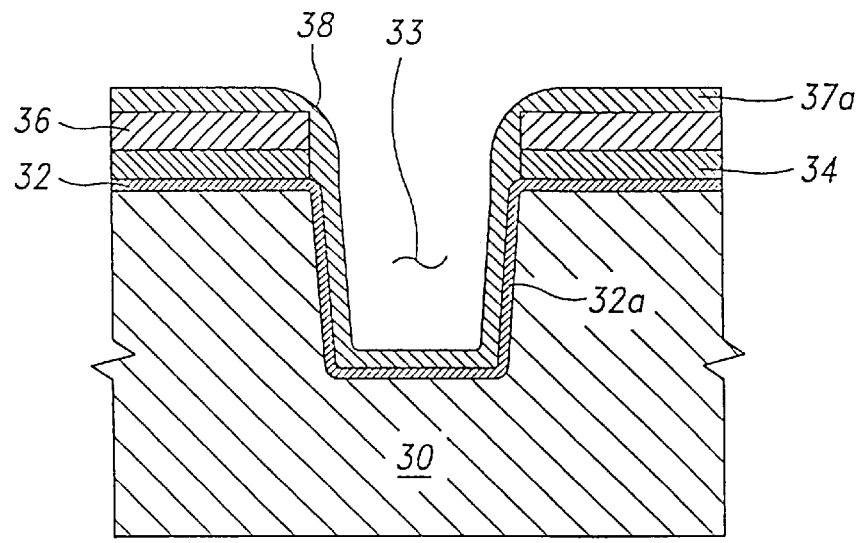

Referring to FIGS. 3, 10 and 11, the process of forming the PE-TEOS layer 37a (step 55) comprises the sub-step of depositing a PE-TEOS layer (step 55a) and an etchback process (step 55b).

Referring now to FIGS. 3 and 10, after the growth of sidewall silicon dioxide 32a on the sidewall of the trench 30, PE-TEOS 37a is deposited on the silicon substrate 30 and the sidewall of the trench 33 (step 55a). The PE-TEOS 37a is preferably deposited using an atmospheric CVD process.

Referring now to FIGS. 3 and 11, the PE-TEOS layer 37a around the entrance 33a of the trench 33 is then etched back at step 55b. The etchback process (step 55b) makes the entrance 33a of the trench 33 wider. Preferably an argon plasma is used for this etchback process. The reference numeral 38 designates the state of the entrance 33a of the trench 33 which is etched back.

A second sidewall oxidation or a first annealing process is then provided to enhance the bonding force between the sidewall silicon dioxide layer and the sidewall of the trench (step 56). Due to the action of plasma during the etchback process (step 55b) using argon, the bonding force between the sidewall silicon dioxide layer 32a and the sidewall of the trench 33 can be lowered. Accordingly, the present invention provides the second sidewall oxidation or the first annealing process to enhance the bonding force at step 56. The second sidewall oxidation preferably proceeds under the same condition as the first sidewall oxidation (step 54). The first annealing process occurs preferably between 600 and 1200° C. under $N_2$ atmosphere for about 50–70 minutes, most preferably for about 60 minutes.

In the preferred embodiment the first annealing and the second sidewall oxidation proceed alternatively during step 56, with the first annealing being preferably to the second sidewall oxidation in step 56. In alternate embodiments, however, both the first annealing and the second sidewall oxidation can be performed in step 56.

Due to the action of plasma during the etchback process (step 55b) using argon, impurities are deposited on the PE-TEOS layer 37a. Thus, the surface of the PE-TEOS layer 37a becomes rough. Accordingly, an $NH_3$ plasma treatment (step 57) is provided to smooth the surface of the PE-TEOS layer 37a by removing the impurities deposited on the PE-TEOS layer 37a and to enhance the bonding force between the PE-TEOS layer 37a a the $O_3$-TEOS layer which will be deposited on the PE-TEOS layer 37a. The thickness of the PE-TEOS layer 37a deposited on the hard mask 36 and the sidewall silicon dioxide layer 32a after $NH_3$ plasma treatment 57 is preferably 1000 to 5000 Å.

Figure 12:
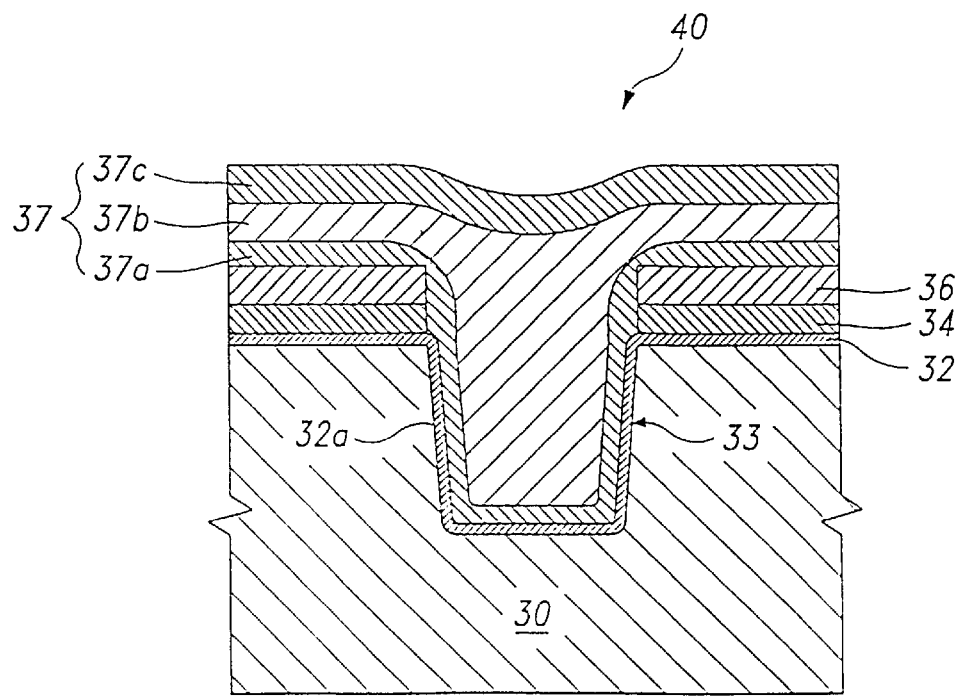

To describe the process of $O_3$-TEOS and PE-TEOS deposition at step 58 to fill the trench 33, refer now to FIGS. 3 and 12. The trench 33 is filled with $O_3$-TEOS 37b by depositing $O_3$-TEOS 37b over the PE-TEOS layer 37a. Another PE-TEOS layer 37c is then deposited over the $O_3$-TEOS layer 37b. These $O_3$-TEOS and PE-TEOS layers 37b and 37c are preferably deposited using atmospheric CVD. The thickness of the $O_3$-TEOS layer 37b and the PE-TEOS layer 37c deposited on the PE-TEOS layer 37a is 3000 to 7000 Å respectively.

Finally, the second annealing process (step 59) is provided, completing the formation of the trench isolation structure. This second annealing process (step 59) is preferably performed at about 1050° C. under $N_2$ atmosphere for about 50–70 minutes, most preferably for about 60 minutes.

The other processes of fabricating semiconductor devices are then performed after the formation of the trench isolation structure.

FIG. 12 is a schematic drawing of a V-SEM photograph of a cross-sectional view of the trench 33 formed in the silicon substrate 30, which shows the Si-SiO$_2$ interface 33a with no void. FIG. 12 shows a silicon dioxide layer 32 on the silicon substrate 30, a silicon nitride layer 34, a hard mask layer 36, and a trench 33 filled with an insulator 37 such as PE-TEOS 37a, $O_3$-TEOS 37b, and PE-TEOS 37c.

In the drawings and specification, a typical preferred embodiment of the invention has been disclosed and, although specific terms are employed, they are used in a generic and descriptive sense only and not for purposes of limitation, the scope of the invention being set forth in the following claims.

What is claimed is:

1. A method for forming a trench isolation structure in a silicon substrate of a semiconductor device, the method comprising steps of:

(a) forming a silicon dioxide layer over the silicon substrate;

(b) forming an etching mask over the silicon dioxide layer;

(c) photo-etching the silicon dioxide layer and the etching mask to expose a portion of the silicon substrate;

(d) trench-etching the exposed portion of the silicon substrate to form a trench in the silicon substrate;

(e) performing an oxidation process to grow a sidewall silicon dioxide on a sidewall of the trench;

(f) forming a first insulating layer over the silicon substrate and the sidewall of the trench;

(g) providing an interface treatment so as to enhance a bonding force between the sidewall silicon dioxide and the sidewall of the trench;

(h) filling the trench with a second insulating layer, after providing the interface treatment; and (i) performing an annealing process.

2. A method as recited in claim 1, wherein the step (b) of providing the etching mask further comprises the sub-steps of:

(b1) depositing silicon nitride over the silicon dioxide layer; and (b2) depositing a hard mask over the silicon nitride layer.

3. A method as recited in claim 1, wherein the first insulating layer comprises PE-TEOS.

4. A method as recited in claim 3, wherein the step (f) of forming the first insulating layer further comprises the sub-steps of:

(f1) depositing PE-TEOS over the silicon substrate and on the sidewall of the trench; and (f2) etching back the deposited PE-TEOS around an entrance of the trench to widen the entrance of the trench.

5. A method as recited in claim 4, further comprising a step, performed after the step (f2), of performing an $NH_3$ plasma treatment so as to make a surface of the PE-TEOS layer smooth by removing impurities deposited on the PE-TEOS first insulating layer during etching back of the PE-TEOS first insulating layer and to enhance a bonding force between the PE-TEOS first insulating layer and the second insulating layer.

6. A method as recited in claim 1, wherein the second insulating layer comprises $O_3$-TEOS.

7. A method as recited in claim 1, further comprising a step performed after step (h), of depositing a third insulating layer over the second insulating layer.

8. A method as recited in claim 7, wherein the third insulating layer comprises PE-TEOS.

9. A method as recited in claim 1, wherein the trench is formed to have a depth of 0.5 µm or more.

10. A method as recited in claim 1, wherein the interface treatment is achieved through the use of a second oxidation step.

11. A method as recited in claim 10, wherein the second oxidation step is achieved through the use of a thermal oxidation step.

12. A method as recited in claim 11, wherein the thermal oxidation step is carried out between 600° C. and 1200° C.

13. A method as recited in claim 11, wherein the thermal oxidation step is carried out in a oxidizer selected from the group consisting of $O_2$, an $O_2$—HCl mixture gas, and an $H_2$—$O_2$ reactant gas.

14. A method as recited in claim 10, further comprising a step of performing a first annealing process after the second oxidation step.

15. A method as recited in claim 14, wherein the first annealing process is carried out between 600 and 1200° C.

16. A method as recited in claim 14, wherein the fruit annealing process is carried out under an $N_2$ atmosphere.

17. A method as recited in claim 14, wherein the first annealing process is carried out for about 50–70 minutes.

18. A method as recited in claim 1, wherein the interface treatment is achieved through the use of a first annealing process.

19. The method according to claim 18, further comprising a step of performing a second oxidation process after the first annealing process.

20. A method as recited in claim 19, wherein the second oxidation process is achieved through the use of a thermal oxidation process.

21. A method as recited in claim 20, wherein the thermal oxidation process is carried out between 600 and 1200° C.

22. A method as recited in claim 21, wherein the thermal oxidation process is carried out in a oxidizer selected from the group of $O_2$, an $O_2$—HCl mixture gas, and an $H_2$.$O_2$ reactant gas.

23. A method as recited in claim 18, wherein the first annealing process is carried out between 600 and 1200° C.

24. A method as recited in claim 18, wherein the first annealing process is carried out under an $N_2$ atmosphere.

25. A method as recited in claim 18, wherein the first annealing process is carried out for about 50–70 minutes.

26. A method for forming a trench isolation structure in a silicon substrate of a semiconductor device, the method comprising steps of:

etching a portion of the silicon substrate to form a trench;

growing a sidewall silicon dioxide layer on a sidewall of the trench;

providing an interface treatment to enhance a bonding force between the sidewall silicon dioxide and the sidewall of the trench; and performing an annealing process after the interface treatment.

27. A method as recited in claim 26, wherein the interface treatment is achieved through the use of an oxidation step.

28. A method as recited in claim 27, wherein the oxidation step is a thermal oxidation step.

29. A method as recited in claim 28, wherein the thermal oxidation step is carried out between 600° C. and 1200° C.

30. A method as recited in claim 28, wherein the thermal oxidation step is carried out in a oxidizer selected from the group consisting of $O_2$, an $O_2$—HCl mixture gas, and an $H_2$—$O_2$ reactant gas.

31. A method as recited in claim 26, wherein the interface treatment is achieved through the use of a first annealing process.

32. A method as recited in claim 31, wherein the first annealing process is carried out between 600 and 1200° C.

33. A method as recited in claim 31, wherein the first annealing process is carried out under an $N_2$ atmosphere.

34. A method as recited in claim 31, wherein the first annealing process is carried out for about 50–70 minutes.

* * * * *